United States Patent
Park et al.

(10) Patent No.: US 8,120,029 B2
(45) Date of Patent: Feb. 21, 2012

(54) THIN FILM TRANSISTOR AND METHOD OF MANUFACTURING THE SAME

(75) Inventors: Kyung-bae Park, Seoul (KR);
Myung-kwan Ryu, Yongin-si (KR);
Byung-wook Yoo, Yongin-si (KR);
Sang-yoon Lee, Seoul (KR); Tae-sang Kim, Seoul (KR); Jang-yeon Kwon, Seongnam-si (KR); Kyung-seok Son, Seoul (KR); Ji-sim Jung, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 225 days.

(21) Appl. No.: 12/453,293

(22) Filed: May 6, 2009

(65) Prior Publication Data
US 2010/0059756 A1    Mar. 11, 2010

(30) Foreign Application Priority Data
Sep. 11, 2008 (KR) .................. 10-2008-0090007

(51) Int. Cl.
*H01L 29/04* (2006.01)

(52) U.S. Cl. .......... 257/57; 257/59; 257/66; 257/72; 257/E29.117; 257/E29.273

(58) Field of Classification Search .......... 257/57, 257/59, 66, 72, 348, E29.117, E29.273
See application file for complete search history.

(56) References Cited

U.S. PATENT DOCUMENTS 6,461,901 B1 * 10/2002 Noguchi .................. 438/158

* cited by examiner

*Primary Examiner* — Minh-Loan T Tran
(74) *Attorney, Agent, or Firm* — Harness, Dickey & Pierce, P.L.C.

(57) ABSTRACT

Disclosed is a thin film transistor (TFT). The TFT may include an intermediate layer between a channel and a source and drain. An increased off current, which may occur to a drain area of the TFT, is reduced due to the intermediate layer. Accordingly, the TFT may be stably driven.

20 Claims, 5 Drawing Sheets

THIN FILM TRANSISTOR AND METHOD OF MANUFACTURING THE SAME

PRIORITY STATEMENT

This application claims priority under 35 U.S.C. §119 to Korean Patent Application No. 10-2008-0090007, filed on Sep. 11, 2008, in the Korean Intellectual Property Office (KIPO), the entire contents of which are incorporated herein by reference.

BACKGROUND

1. Field

Example embodiments relate to a thin film transistor (TFT), and more particularly, to a TFT capable of stabilizing an off current.

2. Description of the Related Art

Thin film transistors (TFTs) are used in various application fields and, particularly, are used as switching and driving devices of display apparatuses and as selection switches of cross-point type memory devices.

While liquid crystal display (LCD) apparatuses are mainly used as display panels in televisions (TVs), a large amount of research on organic light-emitting display (OLED) apparatuses that may also be applied to TVs is being conducted. TV display technologies are being developed according to demands of the market. Such demands include demand for large-scaled TVs or digital information display (DID) apparatuses with decreased costs and high definition (high resolution, improved color rendition, improved brightness, improved contrast characteristics, and high color reproducibility). In order to satisfy these demands, substrates, e.g., glass substrates, are required to be larger and TFTs to be used as switching and driving devices of display apparatuses are required for improved performance.

An example of a TFT used as a switching or driving device of a display apparatus is an amorphous silicon (a-Si) TFT which is uniformly formed on a larger substrate of over 2 m in length at a lower cost. However, TFTs are required to have improved performance as display apparatuses, require high-definition characteristics and larger sizes, and thus, the display apparatuses are regarded as being limited by the operating capabilities of typical a-Si TFTs having a mobility of about 0.5 cm$^2$/Vs. Thus, a high-performance TFT having a higher mobility than an a-Si TFT, and a technology of manufacturing the high-performance TFT are required.

A polysilicon (poly-Si) TFT with higher performance than an a-Si TFT has a higher mobility of several tens to several hundred cm$^2$/Vs, and thus, may have a sufficiently high performance to be applied to high-definition display apparatuses, which are not easily implemented by using a-Si TFTs. Also, poly-Si TFTs have less device characteristic deterioration than a-Si TFTs. However, the poly-Si TFT has a relatively high off current while being driven, and therefore, the poly-Si TFT cannot easily function as a switching device of a display apparatus.

In a conventional TFT, the source and drain directly contact a channel. Thus, a strong lateral field may be formed particularly on the drain, an off current of the conventional TFT may be undesirably high, and the conventional TFT may not be stably driven.

SUMMARY

Example embodiments include a thin film transistor (TFT) having a structure capable of stabilizing an off current. Example embodiments also include a method of manufacturing the TFT. Additional aspects will be set forth in part in the description which follows and, in part, will be apparent from the description, or may be learned by practice of example embodiments.

According to example embodiments, a thin film transistor (TFT) may include an intermediate layer between a channel and a source and drain, wherein the intermediate layer covers both sides and a portion of an upper surface of the channel.

The TFT may further include a gate on an area of a substrate; a gate insulating layer on the substrate and the gate; the channel on the gate insulating layer corresponding to the gate; the intermediate layer on the gate insulating layer and the channel; and the source and drain on the intermediate layer. The TFT may further include an ohmic layer between the intermediate layer and the source and the drain.

In example embodiments, the intermediate layer may have a thickness of about 10~1000 Å. The channel may be formed of polysilicon (poly-Si). The intermediate layer may be formed of amorphous silicon (a-Si), poly-Si, germanium (Ge), or silicon-germanium (SiGe). The ohmic layer may be formed of n-type Si (n-Si) on which phosphorus (P) is doped, or p-type Si (p-Si) on which boron (B) is doped. The gate and the source and drain may be formed of a conductive material or a conductive oxide. The gate and the source and drain may be formed of titanium (Ti), platinum (Pt), ruthenium (Ru), gold (Au), silver (Ag), molybdenum (Mo), aluminum (Al), tungsten (W), copper (Cu), indium-zinc oxide (IZO) or aluminum-zinc oxide (AZO).

According to example embodiments, a method of manufacturing a thin film transistor (TFT) may include forming an intermediate layer between a channel and a source and drain, wherein forming the intermediate layer includes covering both sides and a portion of an upper surface of the channel.

In example embodiments, the method may further include forming a gate on an area of a substrate; forming a gate insulating layer on the substrate and the gate; forming the channel on the gate insulating layer corresponding to the gate; forming the intermediate layer and a conductive material layer on the gate insulating layer and the channel; and forming the source and drain by etching the intermediate layer and the conductive material layer so as to expose an upper surface of the channel. The method may further include forming an ohmic layer between the intermediate layer and the conductive material layer.

In example embodiments, the intermediate layer may have a thickness of about 10~1000 Å. Forming the channel may include coating silicon (Si) on the gate insulating layer; and performing a heat treatment process on the coated gate insulating layer in order to crystallize Si into polysilicon (poly-Si). The heat treatment process may be performed by a 308 nm excimer laser method, a solid phase crystallization (SPC) method, or a metal induced crystallization (MIC) method.

In example embodiments, the intermediate layer may be formed of amorphous silicon (a-Si), poly-Si, germanium (Ge), or silicon-germanium (SiGe). The ohmic layer may be formed of n-type Si (n-Si) on which phosphorus (P) is doped, or p-type Si (p-Si) on which boron (B) is doped. The gate and the source and drain may be formed of a conductive material or a conductive oxide. The gate and the source and drain may be formed of titanium (Ti), platinum (Pt), ruthenium (Ru), gold (Au), silver (Ag), molybdenum (Mo), aluminum (Al), tungsten (W), copper (Cu), indium-zinc oxide (IZO) or aluminum-zinc oxide (AZO). The TFT may be formed by a chemical vapor deposition (CVD) process, a sputtering process, or an atomic layer deposition (ALD) process.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

FIG. 1 is a cross-sectional diagram of a thin film transistor (TFT), according to example embodiments;

FIG. 3 is a graph of variations in a gate-source voltage and a source-drain current of each of a TFT according to example embodiments and a TFT according to the related art, when a drain voltage is 0.1V;

FIG. 4 is a graph of off currents of a TFT according to example embodiments and a TFT according to the related art, after measuring variations in a gate-source voltage and a source-drain current when a drain voltage is 10V; and FIG. 5 is a graph of off currents of TFTs in which intermediate layers are formed on different areas, after measuring variations in a gate-source voltage and a source-drain current.

Figure 1:
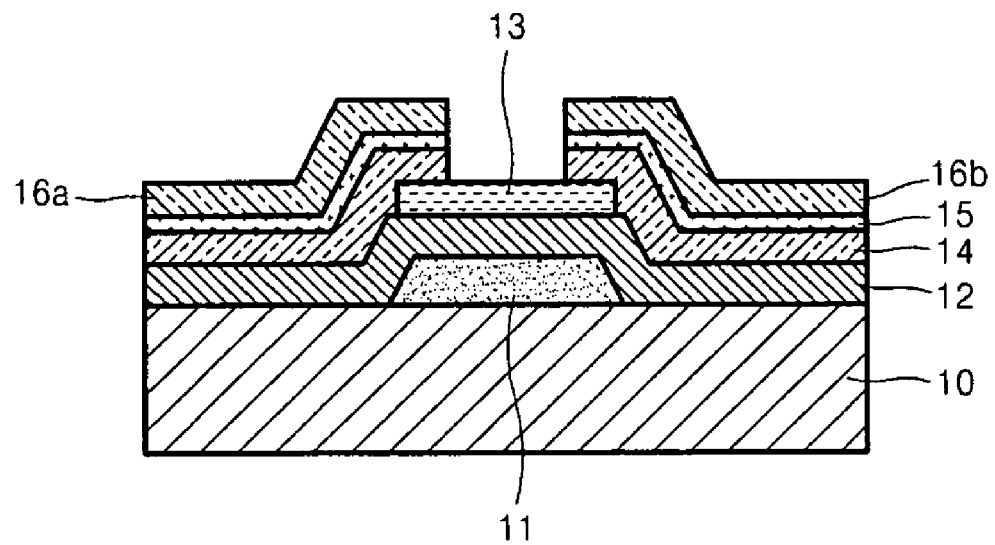

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below by referring to the figures. These example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional diagram of a thin film transistor (TFT), according to example embodiments. Referring to FIG. 1, the TFT may include a gate 11 formed on an area of a substrate 10, and a gate insulating layer 12 formed on the substrate 10 and the gate 11. If the substrate 10 is formed of silicon (Si), the TFT may further include an oxide layer (not shown) formed on a surface of the substrate 10 through a thermal oxidation process. A channel 13 may be formed on the gate insulating layer 12 corresponding to the gate 11, an intermediate layer 14 may be formed on the gate insulating layer 12 and both sides of an upper surface of the channel 13, and source and drain 16a and 16b may be formed on the intermediate layer 14. Selectively, the TFT may further include an ohmic layer 15 for ohmic contact, which is formed between the intermediate layer 14, and the source and the drain 16a and 16b. A material forming each layer of the TFT will now be described.

The substrate 10 may be formed of a material to be used in a conventional semiconductor device, for example, Si, glass, or an organic material. The gate 11 may be formed of a conductive material, for example, a metal, e.g., titanium (Ti), platinum (Pt), ruthenium (Ru), gold (Au), silver (Ag), molybdenum (Mo), aluminum (Al), tungsten (W) or copper (Cu), or a conductive oxide, e.g., indium-zinc oxide (IZO) or aluminum-zinc oxide (AZO). The gate insulating layer 12 may be formed of an insulating material used in a conventional semiconductor device, for example, silicon oxide ($SiO_2$), a high-K material, e.g., hafnium oxide ($HfO_2$), aluminum oxide ($Al_2O_3$), or silicon nitride ($Si_3N_4$) having a higher dielectric constant than $SiO_2$, or a mixture thereof. The channel 13 may be formed of polysilicon (poly-Si).

The intermediate layer 14 formed on the channel 13 may be formed of amorphous silicon (a-Si), poly-Si, germanium (Ge), or silicon-germanium (SiGe), and may have a thickness of about 10~1000 Å. The ohmic layer 15 formed on the intermediate layer 14 may be formed of n-type Si (n-Si) on which phosphorus (P) is doped, or p-type Si (p-Si) on which boron (B) is doped. The source and the drain 16a and 16b may be formed of a conductive material, for example, a metal, e.g., Ti, Pt, Ru, Au, Ag, Mo, Al, W, or Cu, or a conductive oxide, e.g., IZO or AZO.

An oxide semiconductor according to example embodiments may form the intermediate layer 14 formed of a-Si on the channel 13, and thus, a vertical lateral field, which is concentrated on the drain 16b, may be reduced. The oxide semiconductor according to example embodiments may be used as a channel material of a driving transistor of a liquid crystal display (LCD) apparatus or an organic light-emitting display (OLED) apparatus, or may be used as a channel material of a selection transistor or a transistor forming a peripheral circuit of a memory device.

Figure 2A:
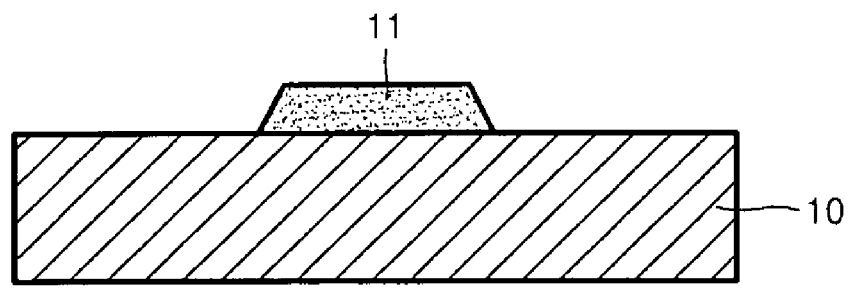
FIGS. 2A-2E are diagrams for describing a method of manufacturing a TFT, according to example embodiments.

FIGS. 2A-2E are diagrams for describing a method of manufacturing a TFT, according to example embodiments. Referring to FIG. 2A, a gate 11 may be formed by depositing and patterning a conductive material on a substrate 10. The substrate 10 may be formed of Si, glass, or an organic material, and the gate 11 may be formed of, for example, a metal, e.g., Ti, Pt, Ru, Au, Ag, Mo, Al, W, or Cu, or a conductive oxide, e.g., IZO or AZO.

Figure 2B:
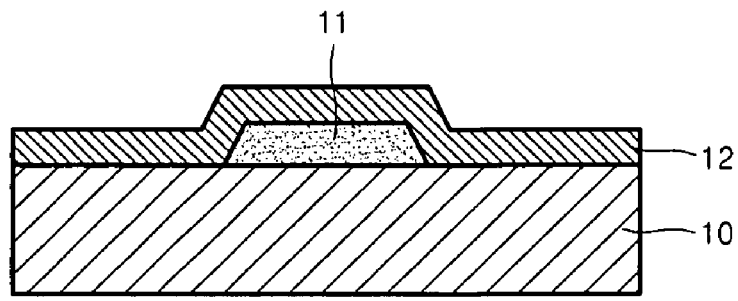

Referring to FIG. 2B, a gate insulating layer 12 may be formed by coating an insulating material on the substrate 10 and the gate 11. The gate insulating layer 12 may be formed of, for example, $SiO_2$, a high-K material, e.g., $HfO_2$, $Al_2O_3$, or $Si_3N_4$, having a higher dielectric constant than $SiO_2$, or a mixture thereof.

Figure 2C:
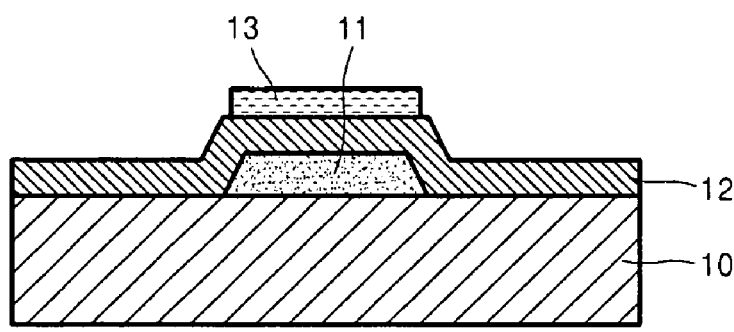

Referring to FIG. 2C, a channel 13 may be formed by coating a channel material, e.g., Si, on the gate insulating layer 12, and the channel material may remain on an area corresponding to the gate 11. If Si is used as the channel material, a heat treatment process may be performed in order to crystallize Si. For example, Si may be crystallized by using a 308 nm excimer laser method, a solid phase crystallization (SPC) method, or a metal induced crystallization (MIC) method, in order to form poly-Si.

Figure 2D:
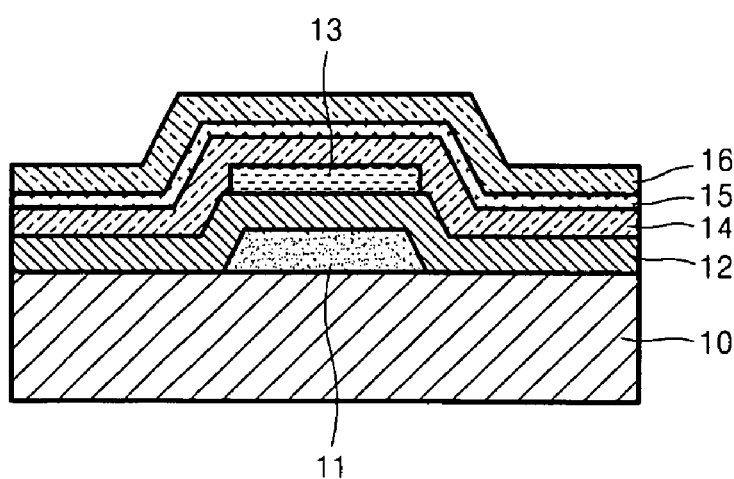
Figure 2E:
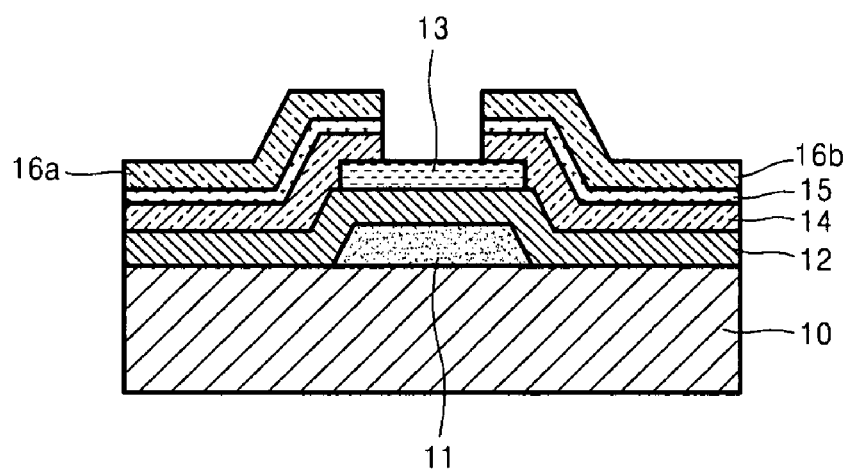

Referring to FIG. 2D, an intermediate layer 14 may be formed on the gate insulating layer 12 and the channel 13, and a conductive material layer 16 may be formed on the intermediate layer 14 in order to form source and drain 16a and 16b (see FIG. 2E). The intermediate layer 14 may be formed of a-Si, poly-Si, Ge, or SiGe. If an ohmic layer 15 is to be further formed on the intermediate layer 14, the ohmic layer 15 may be formed of n-Si on which P+ is doped, or p-Si on which B is doped. The conductive material layer 16 may be formed of, for example, a metal, e.g., Ti, Pt, Ru, Au, Ag, Mo, Al, W, or Cu, or a conductive oxide, e.g., IZO or AZO.

Referring to FIG. 2E, a patterning process may be performed on the intermediate layer 14, the ohmic layer 15, and the conductive material layer 16 so as to expose an upper surface of the channel 13. Accordingly, the conductive material layer 16 may be formed into the source and the drain 16a and 16b. The TFT according to example embodiments may be formed through a chemical vapor deposition (CVD) process, a sputtering process, or an atomic layer deposition (ALD) process.

Figure 3:
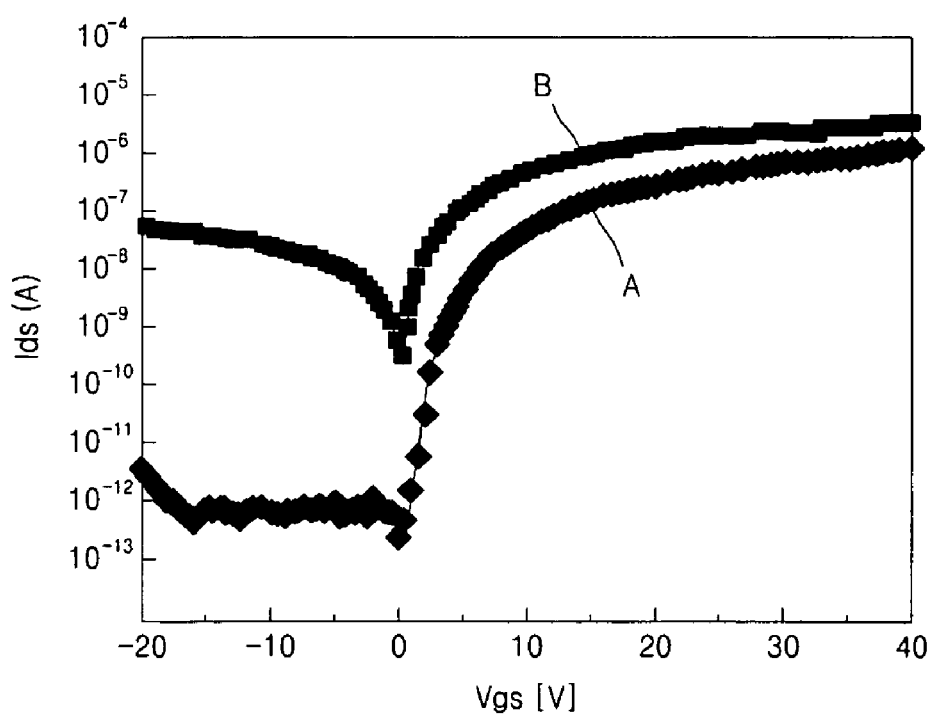

FIG. 3 is a graph of variations in a gate-source voltage Vgs and a source-drain current Ids of each of a TFT A according to example embodiments and a TFT B according to the conventional art, when a drain voltage Vd is 0.1V. The a-Si layer having a thickness of about 500 Å may be formed as an intermediate layer in the TFT A and the intermediate layer is not formed in the TFT B.

Referring to FIG. 3, on currents of the TFT A and the TFT B are similar to each other. However, an off current of the TFT B, which is about $10^{-7}$ A, is higher than the off current of the TFT A, which is about $10^{-13}$ A. The off current of the TFT B is regarded as being abnormally increased due to an excessive vertical lateral field that is concentrated on a drain. However, the off current of the TFT A is regarded as being electrically stable due to the intermediate layer.

Figure 4:
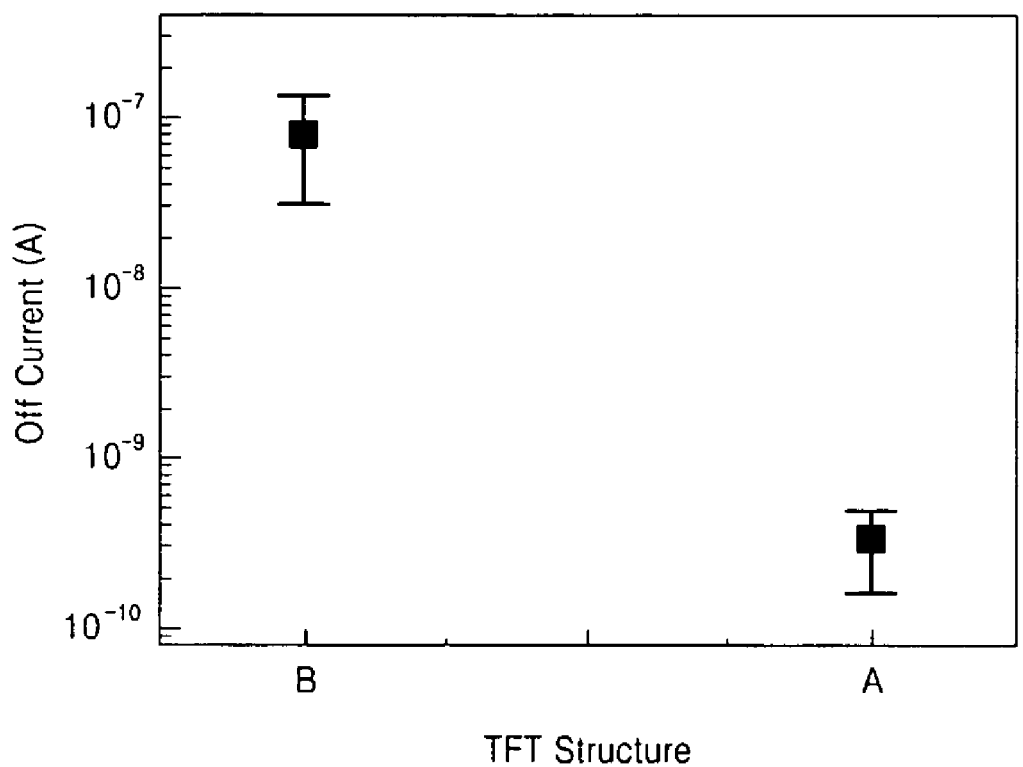
Figure 5:
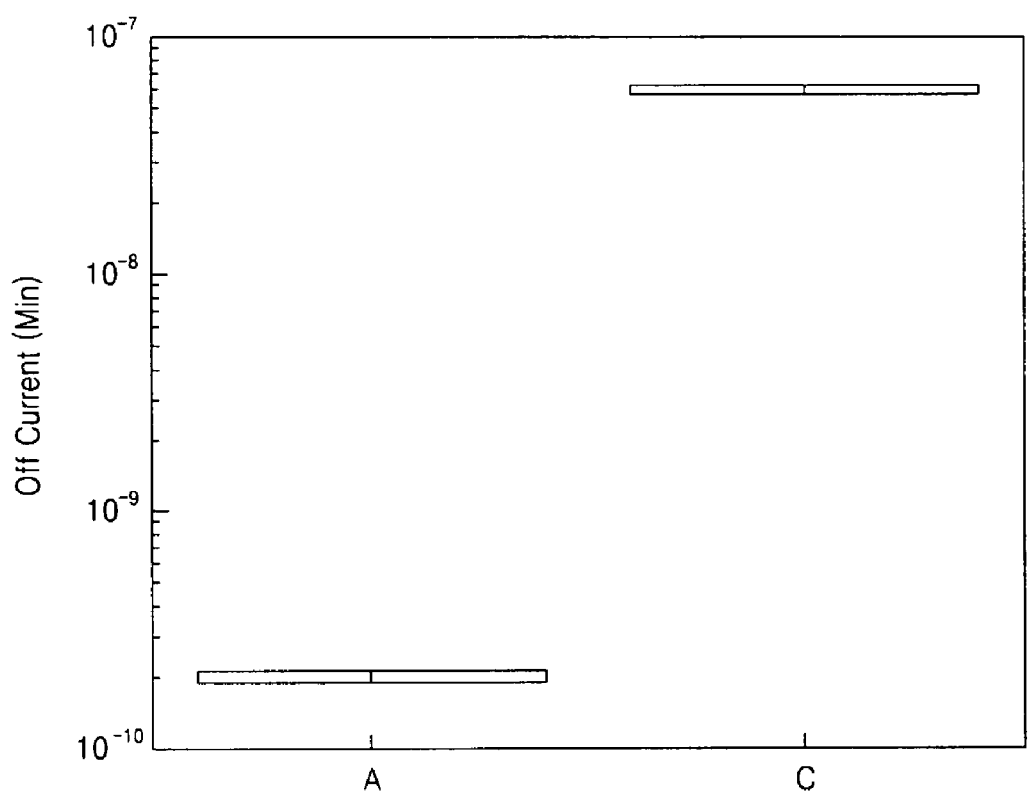

FIG. 4 is a graph of off currents of the TFTs A and B of FIG. 3, after measuring variations in a gate-source voltage Vgs and a source-drain current Ids when a drain voltage Vd is about 10V. Referring to FIG. 4, the off current of the TFT A, in which a-Si having a thickness of about 500 Å is formed, may be smaller than the off current of the TFT B. FIG. 5 is a graph of off currents of the TFT A of FIG. 3 and a TFT C in which an intermediate layer is formed on a different area from the TFT A, after measuring variations in a gate-source voltage Vgs and a source-drain current Ids. The intermediate layer may be formed on an upper surface and sides of a channel in the TFT A while the intermediate layer is formed only on the upper surface of the channel in the TFT C.

Referring to FIG. 5, the off current of the TFT A is smaller than the off current of the TFT C because the intermediate layer may be formed only on the upper surface of the channel in the TFT C, and thus, a strong lateral field may be formed due to a contact between a drain and a side of the channel.

According to example embodiments, one skilled in the art may manufacture various electronic devices, for example, a driving transistor of a flat panel display apparatus, e.g., an LCD apparatus or an OLED apparatus, and a transistor for forming a peripheral circuit of a memory device, by using an oxide semiconductor of example embodiments.

It should be understood that example embodiments described therein should be considered in a descriptive sense only and not for purposes of limitation. Descriptions of features or aspects within each embodiment should typically be considered as available for other similar features or aspects in other example embodiments.

What is claimed is:

1. A thin film transistor (TFT) comprising:
   an intermediate layer between a channel and a source and drain,
   wherein the intermediate layer covers both sides and a portion of an upper surface of the channel, and another portion of the upper surface of the channel is exposed.

2. The TFT of claim 1, further comprising:
   a gate on an area of a substrate;
   a gate insulating layer on the substrate and the gate;
   the channel on the gate insulating layer corresponding to the gate;
   the intermediate layer on the gate insulating layer and the channel; and
   the source and drain on the intermediate layer.

3. The TFT of claim 2, wherein the gate and the source and drain are formed of a conductive material or a conductive oxide.

4. The TFT of claim 3, wherein the gate and the source and drain are formed of titanium (Ti), platinum (Pt), ruthenium (Ru), gold (Au), silver (Ag), molybdenum (Mo), aluminum (Al), tungsten (W), copper (Cu), indium-zinc oxide (IZO) or aluminum-zinc oxide (AZO).

5. The TFT of claim 1, further comprising:
   an ohmic layer between the intermediate layer and the source and the drain.

6. The TFT of claim 5, wherein the ohmic layer is formed of n-type Si (n-Si) on which phosphorus (P) is doped, or p-type Si (p-Si) on which boron (B) is doped.

7. The TFT of claim 1, wherein the intermediate layer has a thickness of about 10~1000Å.

8. The TFT of claim 1, wherein the channel is formed of polysilicon (poly-Si).

9. The TFT of claim 1, wherein the intermediate layer is formed of amorphous silicon (a-Si), poly-Si, germanium (Ge), or silicon-germanium (SiGe).

10. A method of manufacturing a thin film transistor (TFT) comprising:
    forming an intermediate layer between a channel and a source and drain,
    wherein forming the intermediate layer includes covering both sides and a portion of an upper surface of the channel, and another portion of the upper surface of the channel is exposed.

11. The method of claim 10, further comprising:
    forming a gate on an area of a substrate;
    forming a gate insulating layer on the substrate and the gate;
    forming the channel on the gate insulating layer corresponding to the gate;
    forming the intermediate layer and a conductive material layer on the gate insulating layer and the channel; and
    forming the source and drain by etching the intermediate layer and the conductive material layer so as to expose an upper surface of the channel.

12. The method of claim 11, further comprising:
    forming an ohmic layer between the intermediate layer and the conductive material layer.

13. The method of claim 12, wherein the ohmic layer is formed of n-type Si (n-Si) on which phosphorus (P) is doped, or p-type Si (p-Si) on which boron (B) is doped.

14. The method of claim 11, wherein forming the channel comprises:
    coating silicon (Si) on the gate insulating layer; and
    performing a heat treatment process on the coated gate insulating layer in order to crystallize Si into polysilicon (poly-Si).

15. The method of claim 14, wherein the heat treatment process is performed by a 308 nm excimer laser method, a solid phase crystallization (SPC) method, or a metal induced crystallization (MIC) method.

16. The method of claim 11, wherein the gate and the source and drain are formed of a conductive material or a conductive oxide.

17. The method of claim 16, wherein the gate and the source and drain are formed of titanium (Ti), platinum (Pt), ruthenium (Ru), gold (Au), silver (Ag), molybdenum (Mo), aluminum (Al), tungsten (W), copper (Cu), indium-zinc oxide (IZO) or aluminum-zinc oxide (AZO).

18. The method of claim 11, wherein the TFT is formed by a chemical vapor deposition (CVD) process, a sputtering process, or an atomic layer deposition (ALD) process.

19. The method of claim 10, wherein the intermediate layer has a thickness of about 10~1000Å.

20. The method of claim 10, wherein the intermediate layer is formed of amorphous silicon (a-Si), poly-Si, germanium (Ge), or silicon-germanium (SiGe).

* * * * *